United States Patent [19]

Blanchard et al.

[11] 4,193,003
[45] Mar. 11, 1980

[54] METHOD FOR CONTROLLING THE MIGRATION OF A CHEMICAL SPECIES WITHIN A SOLID SUBSTRATE

[75] Inventors: Bruno Blanchard, Grenoble; Claude Legressus, Fontenay le Fleury; Daniel Massignon, Paris; René Sopizet, Chevilly la Rue; René Stefani, Meylan, all of France

[73] Assignee: Commissariat a l'Energie Atomique, Paris, France

[21] Appl. No.: 895,382

[22] Filed: Apr. 11, 1978

[30] Foreign Application Priority Data

Apr. 18, 1977 [FR] France .................................. 11569

[51] Int. Cl.² ............................................ H01J 37/06
[52] U.S. Cl. ................................ 250/492 A; 148/186
[58] Field of Search ............... 250/492 A, 492 B, 398, 250/397, 310, 311; 148/186, 188

[56] References Cited

U.S. PATENT DOCUMENTS

| 3,498,852 | 3/1970 | Jamini | 148/186 |
| 3,539,401 | 11/1970 | Yamashita | 250/492 A |
| 3,725,148 | 4/1973 | Kendall | 148/186 |

*Primary Examiner*—Bruce C. Anderson
*Attorney, Agent, or Firm*—Lane, Aitken & Ziems

[57] ABSTRACT

The method for controlling the migration of an electronegative chemical species within a solid substrate which exhibits ionic conduction consists in irradiating the substrate with electrons which have sufficient energy to penetrate into the substrate and to produce therein metastable excited negative ions of said species and in applying to said substrate an electric field having a direction opposite to the desired direction of migration.

16 Claims, 9 Drawing Figures

METHOD FOR CONTROLLING THE MIGRATION OF A CHEMICAL SPECIES WITHIN A SOLID SUBSTRATE

This invention relates to a method for controlling the migration of a chemical species within a solid substrate. One of the chief applications of the invention is in the technology of semiconductors, especially in the purification of semiconductors by removal of oxygen.

Two principal methods are already employed in the technology of semiconductors in order to modify the concentration of impurities or of doping agent in a substrate. These two known methods consist of gas-phase diffusion and ion implantation.

The first method utilizes the possibility of displacement of impurities within a semiconductor at high temperature and is based on the phenomenon of diffusion within a solid.

From a practical standpoint, thermal diffusion of impurities takes place within a furnace having two zones at different temperatures. A container for the impurities to be diffused is placed in the first zone and the semiconductor to be treated is placed in the second zone. The impurities are transported from the first zone to the second by means of a carrier gas having a very low rate of flow.

The principle employed in thermal diffusion is to impart an energy of the order of 0.1 eV to the impurities in order to ensure that these latter can pass through the potential barriers which they encounter within the crystal. However, this energy is sometimes insufficient to obtain certain profiles required for good operation of semiconductors and it proves necessary in that case to have recourse to the technique known as ion implantation.

This method consists in causing ions of very high energy (30 to 300 keV) to penetrate into a semiconductor substrate. These ions are released by an ion source (gaseous plasma, for example), pass through a particle accelerator in which the necessary energy is imparted to the ions; these latter are then focused, sorted by a mass separator and finally strike a target constituted by the semiconductor substrate.

When the high-energy ions penetrate into the ordered lattice of the semiconductor, they interact with this latter. The incident ions lose energy which they yield either to the nuclei or to the outer-shell electrons. This results in a disturbance of the crystal order, thus creating disordered regions which are of greater or lesser extent according to the dose of incident ions.

As a result of the disturbance thus created by the implanted ions, it is necessary to anneal the implanted layers at a sufficiently high temperature to rearrange the disturbed zones.

If the doping profiles obtained are intended to be carefully controlled, both the energy and the dose of implanted particles must be determined with accuracy. One of the essential difficulties presented by the application of the ion implantation process lies in the need for very accurate control of implanted doses when these latter are of very small value, for example of the order of $10^{11}$ ions/cm$^2$.

The present invention provides a new technology which is primarily although not exclusively applicable to semiconductors and differs from the two methods discussed in the foregoing both in the means employed and in the results obtained but can nevertheless be combined with these latter if necessary.

The methods of gas-phase diffusion and ion implantation make it possible to introduce a chemical species in a solid substrate. But they are usually unsuitable for the purpose of modifying the concentration profile of a chemical species which is already present within a solid unless recourse is had to an external addition of material.

It proves desirable in some instances, however, to modify the concentration of a chemical species distributed within a solid substrate by means of a simple migration process which is not accompanied by an external addition of doping agent or of impurities.

This is the case in particular when it is desired to purify a semiconductor, for example by removal of the oxygen content. It is in fact known that the presence of this element usually has an adverse effect on the good operation of semiconductors, especially gallium arsenide.

This is also the case when it is desired to create an oxide barrier constituting a so-called buried channel near the surface of a silicon semiconductor.

Finally the same requirement again applies when it is desired to remove carbon from a metal in order to prevent graphitization phenomena.

The precise object of the invention is to introduce a new and novel technology for solving these problems.

It will be noted that, in the two methods of the prior art which have been recalled in the foregoing, material transport always takes place from the surface of the substrate to the deep layers and in the majority of instances in a direction at right angles to the surface. It is true that an oblique implantation can be adopted in certain cases but the obliquity of incidence is always of small value; it is not possible in any case to carry out a displacement of impurities or of doping agents in an opposite direction, namely from the deep layers of the substrate to the surface; neither is it possible to effect this displacement in a direction parallel to the surface of the substrate.

In this instance also, the present invention provides a technology which makes it possible to displace a chemical species within a solid in any direction and especially from the deep layers to the surface.

Furthermore, the method according to this invention is not subject to the disadvantage mentioned above in connection with ion implantation, namely the need to carry out an annealing operation for rearranging the crystal lattice which has been put in a disordered state as a result of the incident ion bombardment. In fact, the method according to the present invention is much less violent than the method of the prior art by reason of the fact that bombardment of the substrate, though still necessary, in fact consists in this case of electron or photon bombardment which does not produce such a deep disturbance of the crystal lattice. In practice, the method contemplated in the present invention is therefore easier to carry out than the ion implantation technique.

Finally, the method in accordance with the invention has a broader range of application than the two methods recalled in the foregoing. Although it finds a preferential application in the field of semiconductors, the method is equally applicable to other substances or elements such as metals and more generally to all substances which exhibit ionic conduction. In regard to the chemical species which can be caused to undergo displacement by means of the present invention, they are not necessarily the same as those which are suitable for diffusion or ion implantation. Generally speaking, suitable species are those which are capable of producing metastable excited ions. This is the case in particular with oxygen, carbon, phosphorus and chlorine.

The invention is based on a series of theoretical and experimental results obtained by the present Applicant in the field of electron bombardment of solids. These results have permitted the construction of a model which makes it possible to interpret the observed effects in a satisfactory manner. A more detailed description of this model will be given hereinafter but can already be summarized in broad outline as follows.

When a target is bombarded with an electron beam, there takes place a whole series of interactions at the surface and in the interior of the target: elastic backscattering of primary electrons by the surface, ionization of surface atoms, backscattering of primary electrons by the deep layers, discrete energy losses, and so forth. These interactions give rise to known phenomena: stimulated desorption of adsorbed species, emission of Auger electrons, emission of secondary electrons, and so on.

The present Applicant has demonstrated the leading part played by a particular interaction related to the phenomenon of resonant capture of electrons which results in dissociation; this phenomenon is known per se (for example in the gases which are subjected to electron bombardment) and is generally referred-to as "Dissociative Resonance Electron Capture", abbreviated to DREC. By means of a mechanism of this type, a chemical species X is capable of undergoing transformation into a negatively ionized excited species which can be designated by the notation $X^{-*}$, in which the minus sign indicates the negative character of the ion formed by electron capture and the sign "*" indicates that this ion is excited.

The present Applicant has observed that, at the time of bombardment of certain solids, especially semiconductors (such as silicon and gallium arsenide, for example) and metals (such as tungston and platinum, for example) with a beam of electrons of suitable energy, certain chemical species (especially oxygen, carbon, phosphorus, fluorine, chlorine) form excited negative ions of this type and that said excited ions exhibit a metastable character. The lifetime of these ions is in fact considerably longer than one microsecond and can attain a fraction of a millisecond and even exceed one millisecond.

If the medium in which said excited ions appear is an ionic conductor or in other words if the ionic mobility in said medium is high, it is possible to displace the ions in any direction by subjecting the solid to an electric field which has the opposite direction (by reason of the negative character of the ion). De-excitation of the species $X^{-*}$ can then take place at a point which is remote from the zone of formation of the excited species and usually results in regeneration of the species X. The general effect thereby achieved is therefore the same as if the species X had migrated within the solid.

A few orders of magnitude of the phenomena employed in a mechanism of this type can be given by way of explanation. If the species $X^{-*}$ had a lifetime of only 1 $\mu$s and if the ionic mobility within the solid is of the order of 300 m/s (which is the case for example with the oxygen ion in zirconium oxide), it is possible to displace the species $X^{-*}$ over a distance of 300$\mu$ during the lifetime of the excited ion. This is a considerable distance if it is borne in mind that the active zones in semiconductor devices usually have thicknesses of the order of one micron.

It should be clearly understood that the scope of this Application is in no way dependent on the accuracy of the scientific interpretations which have just been given in connection with the phenomena involved. The sole object of these interpretations is to permit a clearer understanding of the basic theory and not of the means to be employed for the practical application of this invention.

In more exact terms, the present invention is therefore directed to a method for controlling the migration of an electronegative chemical species within a solid substrate which exhibits ionic conduction. Said method essentially consists in irradiating said substrate with electrons which have sufficient energy to penetrate into the substrate and to produce therein metastable excited negative ions of said species and in applying to said substrate an electric field having a direction opposite to the desired direction of migration.

This definition brings out a further advantage of the method in accordance with the invention. Whereas only a single parameter (namely the energy of incident particles) is available in the methods of the prior art for controlling the phenomenon of deposition within the solid, the method in accordance with the present invention makes provision for a second parameter which is the applied electric field (intensity, direction, application time). The practical application of the method is accordingly made more flexible.

The electrons with which the substrate is irradiated have an energy which is preferably within the range of approximately 1 keV to 25 keV. The density of the electron beam can be within the range of 100 $\mu$A/mm$^2$ to 1 A/cm$^2$, for example. Any electron source which emits a beam having these characteristics is suitable; this applies in particular to the sources employed in scanning electron microscopes.

The electric field which causes displacement of the excited ion produced within the solid can be generated by any suitable means in a direction opposite to that of the desired displacement since the ion is negative. The field is therefore directed from the surface to the deep layers of the solid when it proves necessary to cause the species to migrate towards the surface of the substrate and in the opposite direction when it proves necessary to induce migration towards the deep layers.

It is readily apparent that the electric field could be applied in other directions such as, for example, in a direction parallel to the surface of the substrate if it proved desirable to induce lateral migration.

In an advantageous alternative embodiment of the method, said electric field is produced by means of electron bombardment of the surface of the substrate. The phenomenon of emission of secondary electrons which accompanies said bombardment leaves positive charges at the surface of the substrate since it is known that the number of secondary electrons usually emitted is higher than that of the incident primary electrons. The electric field resulting from the presence of these positive charges has the effect of attracting the excited negative ions towards the surface.

The alternative embodiment just mentioned is particularly advantageous since the beam of primary electrons is thus caused to perform a double function, namely the formation of the excited ions $X^{-*}$ within the solid and the production of an electric field which is capable of causing these ions to migrate towards the surface.

In a second alternative embodiment, positive charges can be brought directly to the surface of the substrate by any known means, especially by positive ion bombardment.

Finally in a third alternative embodiment, the electric field can be produced by negatively polarizing the substrate with respect to an electrode placed opposite to its surface. This electrode must naturally be transparent to the incident beam of particles if this latter is directed towards the electrode on the substrate. In practice, said electrode can be constituted by the enclosure in which the electron bombardment takes place and which is usually connected to ground, a voltage source being accordingly connected between the substrate and said enclosure.

The applications of the method in accordance with the present invention are numerous. The technology of semiconductors constitutes one of the preferential fields of application.

In this field, consideration may be given to the purification of a semiconductor substrate as a primary objective. In this case, migration takes place towards the surface and is as complete as possible. Migration is followed by removal of the species which has accumulated at the surface of the semiconductor, this being achieved by stripping for example by means of an argon ion bombardment having an intensity of approximately $10^{-5}$ A/cm$^2$ and an energy of approximately 1 keV. This application is particularly important when it proves necessary to purify semiconductors by removal of their oxygen content.

It may also be necessary to obtain a predetermined concentration profile of a chemical species within a substrate. In this case, said species is first introduced into the substrate if it is not already present therein and the method in accordance with the invention is then applied in order to induce migration towards a suitable zone. One example of this application consists in the construction of a buried oxide barrier beneath the surface of a semiconductor. This technology can be employed in the construction of integrated circuits (transistors, memory or storage devices, charge-coupled devices and the like).

This distinctive features and advantages of the present invention will in any case be more clearly brought out by the following description of exemplified embodiments which are given by way of explanation but not in any sense by way of limitation, reference being made to the accompanying drawings, wherein.

Before describing the characteristic features of the invention, it may prove useful to review the theoretical considerations which form the bases of the invention and which will therefore be explained with reference to FIGS. 1 and 2. Once again, it will be readily apparent that these considerations have no bearing whatsoever on the scope of the present Application and are intended only to provide a clearer understanding of the subject matter.

Figure 1:
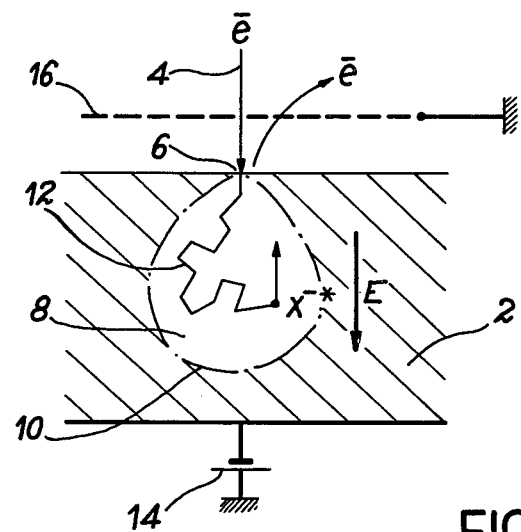
FIG. 1 is a diagrammatic sectional presentation of a solid substrate subjected to electron bombardment.

There is shown in FIG. 1 a cross-section of a substrate 2 of a semiconductor, for example, which is subjected to bombardment by an electron beam 4. There is formed beneath the impact zone 6 a penetration cavity 8 which has roughly the shape of a pear 10. Within this pear-shaped cavity, the electrons undergo multiple impacts and complex interactions, the nature of which has been discussed earlier. A broken-line trajectory is represented diagrammatically by the line 12.

It should be mentioned by way of explanation that, in respect of an electron energy of the order of 5 to 10 keV and in the case of a silicon substrate, the depth and width of the pear-shaped cavity 10 are of the order of one micron.

The phenomenon which is of more particular interest in the present invention is the interaction between an electron and a chemical species X which is present within the solid 2 in any state (in either the interstitial position, the substitutional position or in solution). If the energy of the electron has a correct value, resonant absorption can occur and this has the effect on the one hand of producing a negative ion and on the other hand of bringing this ion to an electronically excited state. This excited species which is designated by the notation $X^{-*}$ has a certain lifetime. The probability of a capture phenomenon of this type depends on the cross-section of the species X.

If the intensity of the electron bombardment beam is of the order of 1 A/cm$^2$, the electron flux is $10^{19}$ electrons per second and per cm$^2$. If the solid exposed to said electron bombardment contains 1% oxygen, for example, which corresponds to a density of $10^{15}$ atoms/cm$^2$, it is therefore possible to obtain on an average $10^{-19} \times 10^{19} \cdot 10^{15} = 10^{15}$ excited molecules per second and per cm$^2$ within the solid.

An electric field E is applied within the substrate 2 by means of a direct-current voltage source 14, the negative pole of which is connected to the substrate and the positive pole of which is connected to a metallic grid 16, said grid being transparent to the electron beam and placed in the vicinity of the surface of the solid 2. The positive pole and the grid are advantageously connected to ground.

Under the action of the field aforesaid, the excited ionized species $X^{-*}$ undergoes displacement towards the surface to an extent which depends on its lifetime and on its mobility within the semiconductor. As stated earlier, the distance over which this ionic species is capable of travelling can be considerable if the excited species has a substantial lifetime. In point of fact, the researches carried out by the present Applicant have shown that this is precisely the case of a certain number of elements and especially oxygen, carbon, phosphorus, fluorine, chlorine and so forth. This migration of $X^{-*}$ towards the surface has the effect of depleting the pear-shaped penetration cavity in the species X.

When it reaches the end of its lifetime, the excited species is usually de-excited as it undergoes dissociation. In the event that the species in which migration is induced is the oxygen molecule, all these phenomena of dissociation by resonant capture of electrons can be summarized by the following reactions:

$$O_2 + e^- \rightarrow O_2^{-*} \rightarrow O^- + O^*$$

The final stage of this mechanism, namely the dissociation of the molecule, can be explained in simplified terms from a knowledge of the variations in potential energy of these molecules as a function of the interatomic distance on the one hand in the case of neutral molecule and on the other hand in the case of the electronically excited molecules.

Figure 2:
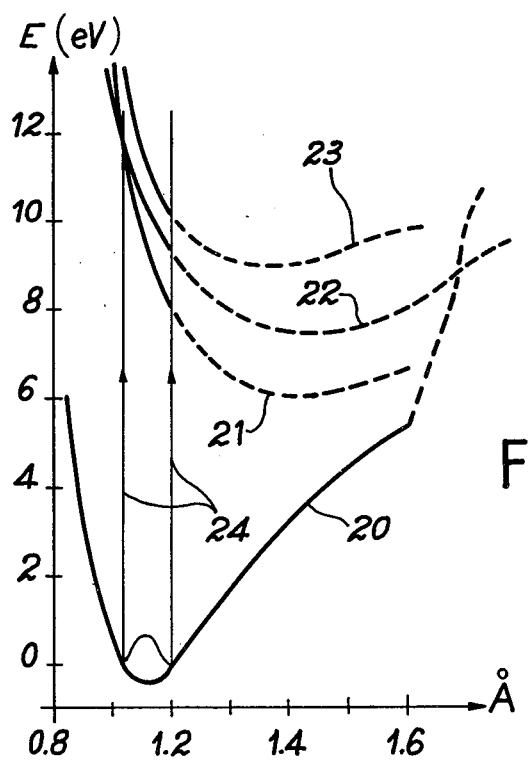
FIG. 2 is an energy diagram showing theoretical curves of different states of the CO molecule.

By way of explanation, the curves plotted in FIG. 2 illustrate these variations in the case of the CO molecule.

In this figure, the variation in potential energy of the CO molecule is represented by the curve 20 in the fundamental state and by the curves 21, 22 and 23 in various excited states. The internuclear distance is plotted as abscissae and expressed in Å and the potential energy E is plotted as ordinates and expressed in electron-volts. The arrows 24 indicate diagrammatically the electron transition produced by capture of an electron. The verticality of the arrows illustrates the Franck-Condon principle in which the separation between the nuclei remains unchanged during an electron transition within a molecule.

These curves show that the excited species $CO^{-*}$ can be brought under the action of electron capture to a higher energy than that of the molecule when the atoms are infinitely remote, which means that the molecule will be dissociated as it undergoes de-excitation.

Further information in regard to the formation of negative ions from an electron beam, especially with reference to the formation of $C^-$ and $O^-$ ions from carbon monoxide, can be found in the article entitled: "Study of Negative Ion Formation by Electron Impact II. $C^-$ and $O^-$ ion formations from carbon monoxide" published by K. Arakawa and T. Sugiura in the review entitled "Mass Spectroscopy", volume 20, No 1, March 1972, pages 51 to 62.

These theoretical considerations having now been set forth, the results obtained from the practical application of the method in accordance with the present invention can now be disclosed with reference to FIGS. 3 to 6.

Figure 3:
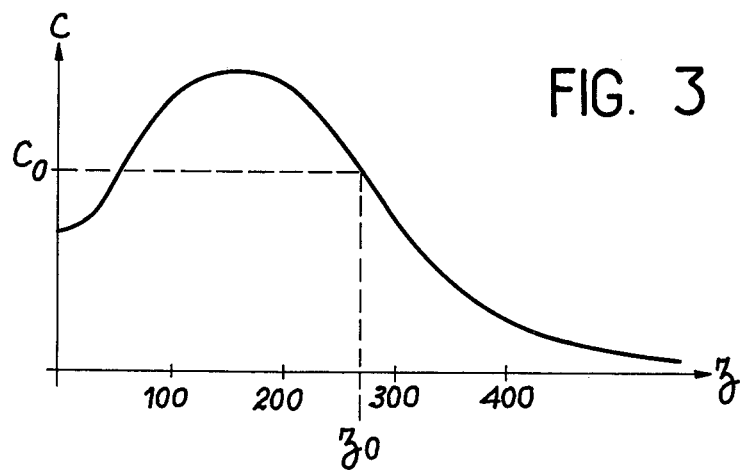
FIG. 3 represents a curve in which the variations in concentration of oxygen in a silicon substrate are shown diagrammatically as a function of the distance to the surface.
Figure 4:
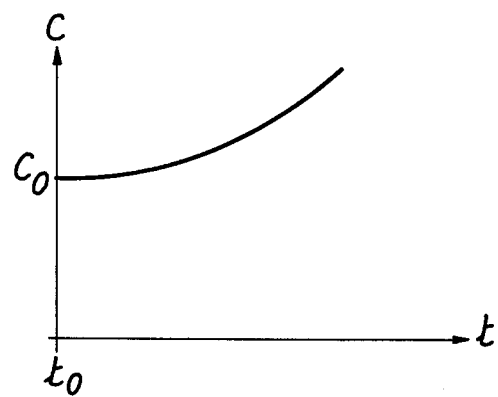
FIG. 4 shows the modification in concentration of oxygen at a predetermined depth of a silicon substrate under the action of electron bombardment.

The curves plotted in FIGS. 3 and 4 show the variations in concentration of oxygen in a silicon substrate as a function of the depth z at a given instant or as a function of time at a given depth. These curves can be obtained either by Auger spectroscopy or by ionic microprobe.

The presence of negative ions at the surface of a substrate can be detected by measuring cross-sections of desorption stimulated by the primary electrons or by spectroscopy of real secondary electrons.

By taking a measurement of secondary electron emission, it is therefore possible to measure the extent of motion of the ions towards the surface of a substrate.

It is in this manner that the curves of FIGS. 3 to 6 have been obtained.

The curve of FIG. 3 shows a typical oxygen concentration profile obtained prior to application of the method according to the invention. An oxygen concentration $C_O$ is found at a depth $z_O$. If the method in accordance with the invention is applied at the instant $t_o$, it is observed that the concentration $C_O$ at the depth $z_O$ increases with the bombardment time; this is shown diagrammatically in FIG. 4. These results are therefore wholly in accordance with the theoretical interpretations given earlier.

Figure 5:
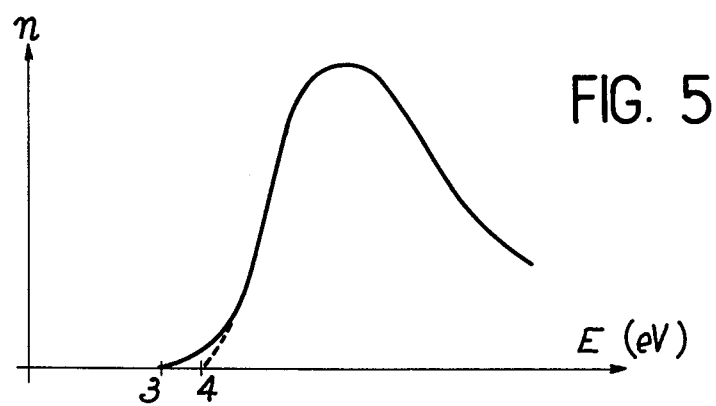
FIG. 5 represents a curve which gives the variation in intensity of the secondary electron emission as a function of the energy of the excitation electrons.

FIG. 5 shows that the formation of the excited ionic species within the solid is a threshold phenomenon, thus confirming the assumption that this is a phenomenon of resonant electron capture. This figure illustrates the curve of variation in intensity of the secondary electron emission produced by a target as a function of the electron energy. The energy E of the secondary electrons is plotted as abscissae and expressed in electron-volts and the number n of secondary electrons is plotted as ordinates in arbitrary units. The shape of the curve clearly shows the existence of a threshold located in the vicinity of 3 to 4 eV and of a peak value corresponding to the maximum probability of resonant capture of oxygen by an electron.

Figure 6:
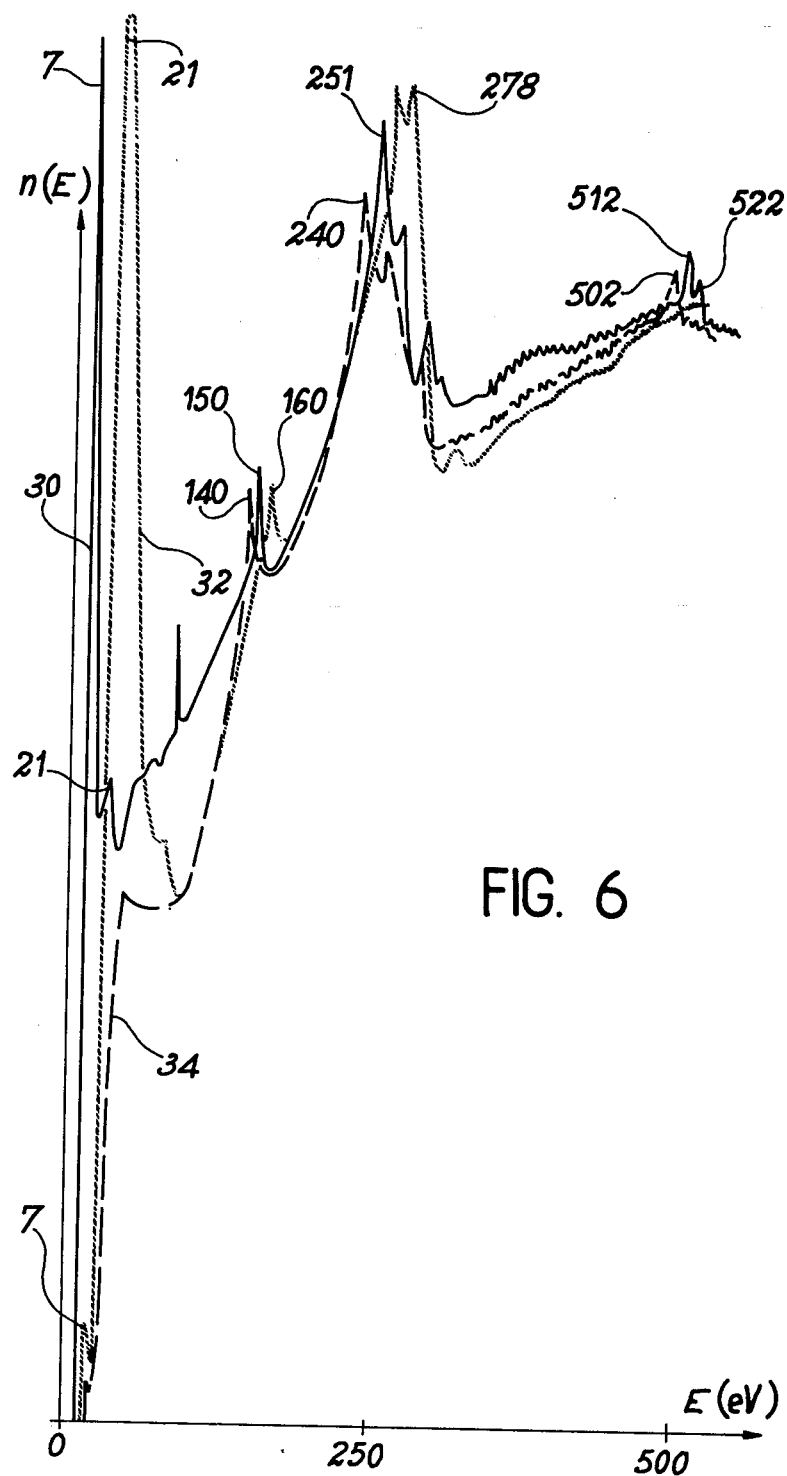
FIG. 6 represents experimental curves obtained by means of a scanning electron microscope when the substrate is of platinum.

FIG. 6 gives other experimental results which give evidence of the migration produced by application of an electric field to the substrate. The curves of FIG. 6 have been obtained by Auger electron spectroscopy. These curves are "spectra" which give the number of secondary electrons n(E) as a function of their energy E expressed in electronvolts. Said curves correspond to the case of a platinum substrate bombarded by an electron beam of energy 10 keV.

It is known in a general manner that a plot of spectra of this type makes it possible to perform a quantitative analysis of the composition of a target since each element or substance appears thereon in the form of a peak, the energy position of which permits identification of this latter. Thus in the case of energies below approximately 50 eV, which corresponds to real secondary electrons, oxygen appears in the form of a peak in the vicinity of 5 to 7 eV and carbon appears in the form of another peak located in the vicinity of 21 eV. At energies higher than about 50 eV, other peaks derived from Auger electrons appear and also serve to identify the elements which are present. The Auger peak for oxygen appears for example at about 510 eV and the Auger peak for carbon appears at about 260 eV. In order to facilitate their identification, the peaks which appear in FIG. 6 are designated by energy references.

The following lessons can accordingly be drawn from this figure.

When the sample is not subjected to any polarization or in other words when no electric field is applied within the target cavity, a spectrum corresponding to the full-line curve 30 is obtained. There can be observed a high oxygen peak at 7 eV energy which denotes the presence of this element at the surface of the substrate and a low peak at 21 eV energy which denotes a low concentration of carbon.

When a bias voltage of −10 V has been applied to the substrate so as to produce an electric field directed from the surface to the deep layers, there is recorded a different spectrum as represented in short-dash lines by the curve 32. Considerable growth of the carbon peak at 21 eV and collapse of the oxygen peak at 7 eV are noted. These results are interpreted as follows: the growth of the peak at 21 eV denotes migration of the $C^-$ ion to the surface of the substrate. However, since the carbon ion can react with the oxygen so as to form carbon monoxide CO, the disappearance of $O^-$ results in reduction of the peak at 7 eV.

It will be noted that the energy position of the peaks at 7 and 21 eV are practically not modified by the application of an electric field and that their intensity is not modified. The same does not apply to the relative peaks at the Auger transitions which are displaced in energy by application of the field. This results in redistribution of the species contained in the target (see in particular the oxygen peak at 512 eV energy which slips to 522 eV).

The long-dash curve 34 gives the spectrum obtained when the bias is reversed by applying +10 V to the substrate, thus producing an electric field which is directed in this case towards the surface. There is noted a practically total disappearance of the peaks at 7 and 21 eV energy, thus resulting in migration of the $C^-$ and $O^-$ ions towards the deep layers of the substrate and consequently in the disappearance of these latter from the surface. The Auger electron peaks undergo an energy displacement in the reverse direction (the oxygen peak at 512 eV energy changes to 502 eV).

All these results clearly show that, by bombarding an ionic conducting substrate with an electron beam and applying a continuous electric field, there is thus produced a migration of the carbon and of the oxygen either towards the surface or in depth according to the direction of application of the field.

The means for carrying out the method in accordance with the invention can be those encountered in instruments for scanning electron microscopy and, in a more general manner, can be those which deliver an electron beam of energy between approximately 1 and 25 keV. For further details, reference can be made to the articles quoted earlier and to books devoted to the subject of electron bombardment.

Figure 7:
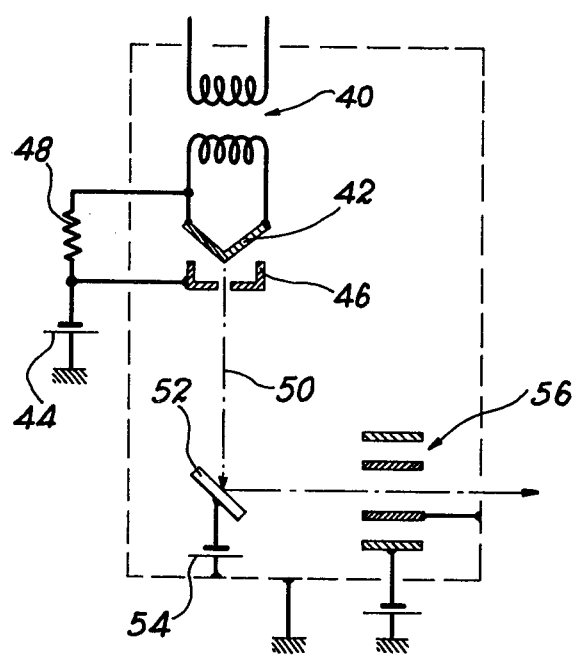
FIG. 7 is a diagrammatic view of an instrument of the scanning electron microscope type for carrying out the method in accordance with the invention and performing an analysis of the surface layers of the substrate.

By way of illustration, FIG. 7 shows a particular embodiment of these means.

An instrument of the scanning electron microscope type is shown in FIG. 7 and comprises an electron source 40 constituted by a filament 42 brought to a suitable temperature and biased by means of a source 44, and an accelerating electrode 46 which is suitably biased with respect to the filament by means of a resistor 48. The electron beam 50 delivered by said source is directed onto a target 52 which supports the substrate to be treated. This target is suitably biased by means of a voltage source 54. There is also shown an electron analyzer 56 which serves to carry out measurements and to obtain curves such as those shown in FIG. 6.

Figure 8:
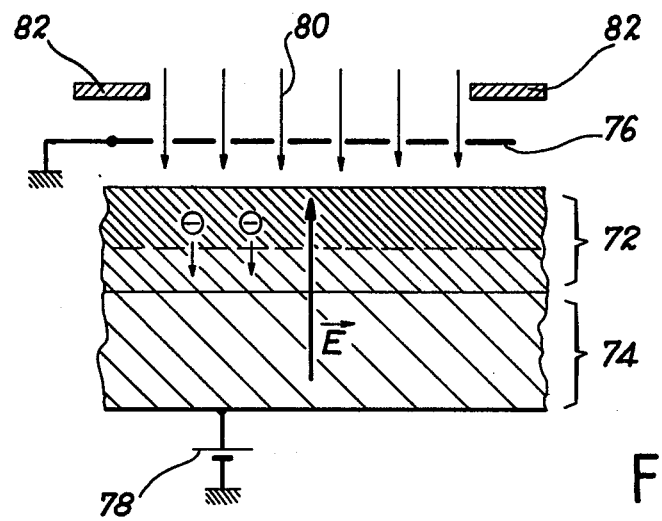
FIG. 8 shows diagrammatically a cross-section of a solid substrate in which the migration occurs in the direction of the deep layers of the substrate.

In FIGS. 1 and 7 described earlier, the electric field was always directed from the surface of the substrate towards the deep layers since it was required to induce migration of the chemical species towards the surface of the substrate in the applications illustrated in the figures. It is readily apparent that said species can be caused to migrate in the opposite direction, namely towards the deep layers in order to free the surface. This is shown diagrammatically in FIG. 8 in connection with a first example of application of the method according to the invention.

In this figure, a first semiconductor substrate 72 is supported by a second semiconductor substrate 74. By way of example, these latter can consist of two semiconductors of different types, namely of the p-type in one case and of the n-type in the other case so as to form a pn junction. A grid 76 is placed in the vicinity of the surface of the substrate 72; a voltage source 78 biases the complete assembly in such a manner as to ensure that the electric field E is directed towards the surface of the substrate.

The grid 76 is in the conducting state, is connected to ground and is sufficiently thin to permit the passage of an electron beam 80. In practice, this grid can be constituted by a layer of metal such as gold for example in the form of a very thin film of approximately 1000 Å, for example.

Under these conditions, bombardment by the electron beam 80 induces the appearance of charged negative ions within the substrate 72 (shaded zone) and the electric field E causes migration of these ions within the deep layers of the substrate 72 in which they are buried. If the electrical characteristics of the semiconductors 72 and 74 are suitable, these negative charges can be trapped at the interface of the two semiconductors. The surface zone of the substrate 72 therefore no longer contains the species such as oxygen, for example, which has migrated.

The method described in the foregoing is well-suited to the known masking technique employed in ion implantation. It is readily apparent that the depth at which the phenomena of resonant electron capture will appear and give rise to the formation of negative ions depends on the penetration of the electron beam into the substrate. In consequence, if part of this substrate is masked, certain zones of the substrate can be preserved even if these latter remain subjected to the migration electric field. This is the case in particular in the left-hand and right-hand portions of the substrate of FIG. 8, these portions being preserved by means of a metallic mask 82.

It is further apparent that the depth of penetration of the electron beam can be adjusted by modifying the electron transparency of the biasing grid 76 and in practice by modifying its thickness.

Figure 9:
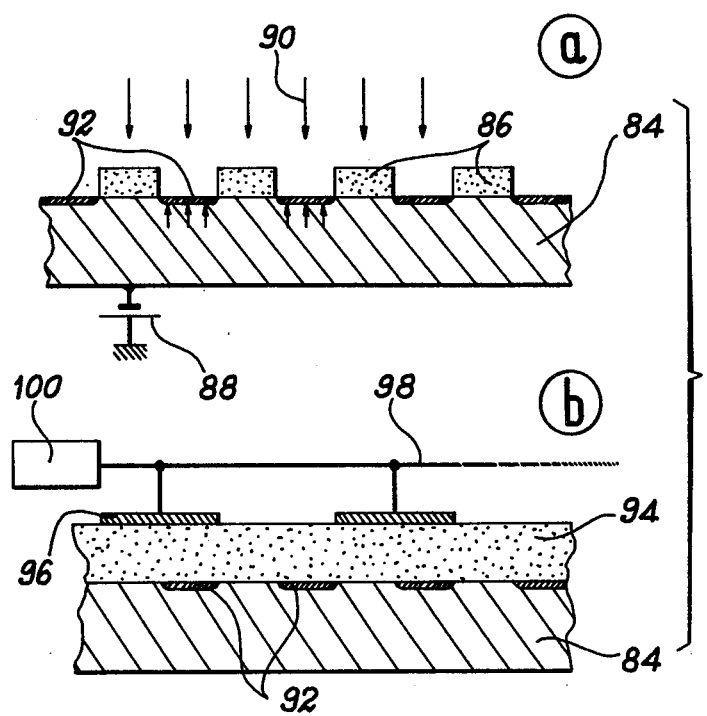
FIG. 9 shows diagrammatically the essential stages of a method of fabrication of a charge-coupled device with one control line which utilizes the method in accordance with the present invention.

FIG. 9 illustrates diagrammatically another application of the method in accordance with the invention to the construction of a charge-coupled device (abbreviated to CCD). It is known that this device is constituted by a semiconductor substrate in which dissymmetrical potential wells have been created in order to permit unidirectional displacement of surface charges. These potential wells can be formed in several ways: by means of a suitable shape of the electrodes or by means of insulating steps having different thicknesses or alternatively by implantation of doped zones beneath the electrodes and within the substrate. Among these charge-coupled devices, those which employ only one control line perform a preferential function since they are very simple to use. In this case, provision must be made within the interelectrode gap for a zone which is also provided with dissymmetrical potential wells for giving a unidirectional character to the charge transfer.

FIG. 9 illustrates two essential stages of a method of fabrication of a device of this type which makes use of the present invention. In the first stage illustrated in FIG. 9a, a layer of insulating material 86 (such as SiO$_2$ obtained by cracking of silane, for example) or of conductive material (such as gold, for example) is deposited on a substrate 84 of silicon, for example. Periodic steps of this material are allowed to remain by etching. The substrate 84 is suitably biased by means of a source 88 and said substrate is subjected to an electron bombardment 90. The thickness of the steps 86 is chosen so as to ensure that these latter constitute a mask which is impermeable to the electron beam 90. This can be obtained by means of metal steps having a thickness within the range of 2000 to 3000 Å. The electron bombardment therefore produces an effect only between the steps. Migration of the oxygen contained in the silicon substrate 84 takes place only between the steps 86 and gives rise to oxidized zones 92.

In a second stage illustrated in FIG. 9b, the substrate is etched in order to remove the steps 86, there being then deposited an insulating layer 94 of SiO$_2$, for example, having a uniform thickness of 1000 Å. There is deposited on this layer a thin metallic film which is etched in order to obtain a series of electrodes 96, said electrodes being then connected to a control line 98 which is connected to a control circuit 100.

The periodicity of the system of electrodes is double that of the insulating steps of FIG. 10a. On completion of the operations, there are consequently found a zone 92 which is placed beneath one of the edges of the electrodes and a zone 92 placed at one end of the interelectrode gap. These dissymmetries beneath the electrodes and the interelectrode gap make it possible to induce a dissymmetry in the surface potential of the semiconductor 84. This dissymmetry gives rise to a suitable potential profile for permitting displacement of charges in a given direction.

It is readily apparent that these examples of construction of semiconductor devices are given solely by way of explanation and that other embodiments can be devised by those versed in the art.

What we claim is:

1. A method for controlling the migration of an electronegative chemical species within a solid substrate which exhibits ionic conduction, wherein said method comprises irradiating said substrate with electrons which have sufficient energy to penetrate into said substrate and produce therein metastable excited negative ions of said species and applying to said substrate an electric field having a direction opposite to the desired direction of migration.

2. Have an energy within the range of approximately 1 keV to 25 keV.

3. A method for controlling the migration of an electronegative chemical species within a solid substrate which exhibits ionic condition, wherein said method comprises the steps of irradiating said substrate with electrons that have sufficient energy to penetrate into said substrate and produce therein metastable excited negative ions of said species and applying to said substrate an electric field directed from the surface of said substrate to the deep layers of said substrate in order to induce migration of said species to the surface of said substrate.

4. The method according to claims 1, 3, or 16 wherein said electric field is produced by electron bombardment which gives rise to secondary electron emission and causes positive charges to appear at said surface of said substrate.

5. The method according to claim 4, wherein a single electron beam is employed both in order to produce the negative ions of said species within said substrate and in order to produce the positive charges at said surface by secondary emission.

6. The method according to claims 1, 3, or 16 wherein said electric field is produced by creating positive surface charges obtained by positive ion bombardment of said surface.

7. The method according to claims 1, 3, or 16 wherein said electric field is produced by applying a negative bias to said substrate with respect to an electrode placed opposite to said surface of said substrate.

8. The method according to claims 1, 3, or 16, wherein said species is selected from the group comprising oxygen, carbon, phosphorus, fluorine and chlorine.

9. The method according to claims 1, 3, or 16 wherein said substrate is a semiconductor.

10. A method according to claim 9, wherein the semiconductor is silicon or gallium arsenide.

11. The method according to claims 1, 3, or 16 wherein said substrate is a metal, especially tungsten or platinum.

12. Application of the method of claims 1, 3, or 16 to the purification of a substrate containing an electronetative chemical species, wherein said method comprises inducing migration of said species to the surface of said substrate and subjecting said substrate to a surface treatment for removing the species which has migrated thereto.

13. Application of the method of claim 12, wherein said substrate is a semiconductor and said chemical species is oxygen.

14. Application of the method of claim 1 to obtain a predetermined concentration profile of an electronegative chemical species within the volume of a substrate, wherein said species is introduced into said substrate and then caused to migrate in a controlled manner in order to obtain the desired profile.

15. Application of the method of claim 14 to the fabrication of a buried oxide barrier beneath the surface of a semiconductor substrate.

16. A method for controlling the migration of an electronegative chemical species within a solid substrate which exhibits ionic conduction, wherein said method comprises the steps of irradiating said substrate with electrons within the energy range of approximately 1 Kev to 25 Kev to penetrate into said substrate and produce therein metastable excited negative ions of said species and applying to said substrate an electric field directed from the surface of said substrate to the deep layers of said substrate in order to induce migration of said species to the surface of said substrate.

* * * * *